United States Patent [19]
Lee et al.

[11] Patent Number: 5,843,817
[45] Date of Patent: Dec. 1, 1998

[54] PROCESS FOR INTEGRATING STACKED CAPACITOR DRAM DEVICES WITH MOSFET DEVICES USED FOR HIGH PERFORMANCE LOGIC CIRCUITS

[75] Inventors: Jin-Yuan Lee; Mong-Song Liang, both of Hsin-Chu, Taiwan

[73] Assignee: Taiwan Semiconductor Manufacturing Company, Ltd., Hsin-Chu, Taiwan

[21] Appl. No.: 933,371

[22] Filed: Sep. 19, 1997

[51] Int. Cl.$^6$ .............................................. H01L 21/8242
[52] U.S. Cl. ............................................ 438/239; 438/241
[58] Field of Search .................. 438/239, 241, 438/253, 254, 381, 396

[56] References Cited

U.S. PATENT DOCUMENTS

| | | | |
|---|---|---|---|
| 5,066,602 | 11/1991 | Takemoto et al. | 437/31 |
| 5,340,762 | 8/1994 | Vora | 437/52 |
| 5,481,493 | 1/1996 | Bergemont | 365/185.18 |
| 5,521,110 | 5/1996 | Gill | 437/43 |
| 5,570,314 | 10/1996 | Gill | 365/185.1 |
| 5,585,292 | 12/1996 | Morita et al. | 437/407 |
| 5,668,035 | 9/1997 | Fang et al. | 438/239 |
| 5,719,079 | 2/1998 | Yoo et al. | 438/238 |
| 5,759,889 | 6/1998 | Sakao | 438/241 |

*Primary Examiner*—Joni Chang
*Attorney, Agent, or Firm*—George O. Saile; Stephen B. Ackerman

[57] ABSTRACT

A semiconductor fabrication process has been developed in which both stacked capacitor DRAM, and MOSFET logic device structures, are integrated on a single silicon chip. The process features combining process steps for both device types. A single dielectric layer is used as a capacitor dielectric layer, for a stacked capacitor DRAM device, and as a gate insulator layer for a MOSFET logic device. In addition a specific polysilicon layer is used for formation of the upper polysilicon electrode, for the stacked capacitor DRAM device, as well as use for formation of the polysilicon gate structure, for the MOSFET logic device. A specific anneal cycle is used to reduce charges in the stacked capacitor DRAM device, while a less severe anneal cycle is used with the shallow junction MOSFET logic device.

20 Claims, 5 Drawing Sheets

PROCESS FOR INTEGRATING STACKED CAPACITOR DRAM DEVICES WITH MOSFET DEVICES USED FOR HIGH PERFORMANCE LOGIC CIRCUITS

BACKGROUND OF THE INVENTION (1) Field of the Invention

This invention relates to fabrication methods used for semiconductor devices, and more specifically a process used to integrate logic and memory devices on a single semiconductor chip.

(2) Description of Prior Art

Advanced semiconductor chips, now being manufactured in industry, are composed of logic or memory devices. Logic devices are used to process information or data, while memory devices are used for data storage. These two types of devices can be found in almost all computers, however they are usually found on specific chips, reserved for either logic or memory applications. In systems in which logic and memory devices are packaged separately, data signals between the two may have to pass through several levels of packaging, which can result in undesirable propagation delays. In addition the manufacturing costs for fabricating wafers producing only logic chips, and wafers with only memory chips, are greater than if both logic and memory applications can be incorporated on the same chip. Therefore for performance and cost reasons the semiconductor industry has been motivated to produce a semiconductor chip with both the desired logic and memory requirements.

The efforts displayed by the semiconductor industry, in attempting to incorporate both logic and memory requirements on a single semiconductor chip have been increasing. Examples of this have been Takemoto, in U.S. Pat. No. 5,066,602, as well as by Vora, in U.S. Pat. No. 5,340,762. These inventions have addressed incorporating bipolar devices and complimentary metal oxide semiconductor, (CMOS), devices, on a single semiconductor chip. However a process for incorporating dynamic random access memory, (DRAM), devices, with logic devices, basically CMOS technology, has not been evident.

This invention will describe a novel fabrication process that allows the memory DRAM devices to be built simultaneously with logic CMOS devices. The process integration allows the DRAM devices to experience the longer thermal cycles, needed for leakage reduction purposes, while the MOSFET logic devices experience shorter thermal cycles, to allow shallow junctions, for high performance purposes, to be realized. In addition the integration allows the same dielectric layer to be used for the gate insulator of the MOSFET logic device, as well as for the capacitor dielectric layer, for the stacked capacitor of the DRAM device.

SUMMARY OF THE INVENTION

It is an object of this invention to provide a process for fabricating stacked capacitor DRAM memory devices, and high performance MOSFET logic devices, on the same silicon chip, or integrated circuit.

It is another object of this invention to use a fabrication sequence that features the use of longer thermal cycles, needed for leakage reductions in stacked capacitor DRAM devices, while featuring shorter thermal cycles, needed for the shallow junctions, required for the high performance MOSFET logic devices.

It is yet another object of this invention to use the same dielectric layer for the gate insulator layer, of the high performance MOSFET device, and for the capacitor dielectric layer, for the stacked capacitor DRAM device.

In accordance with the present invention a fabrication process is described for integrating DRAM memory and MOSFET logic devices on the same silicon chip. After formation of field oxide isolation regions, a DRAM polysilicon gate structure is formed on a first gate insulator layer, on a region of the semiconductor substrate to be used for a stacked capacitor DRAM device. A lightly doped source and drain region is next created in regions of the semiconductor substrate, not covered by the DRAM polysilicon gate structure, followed by the creation of insulator spacers, on the sides of the DRAM polysilicon gate structure. After creation of heavily doped source and drain regions, the DRAM device is subjected to a first anneal cycle, used for leakage reductions. An interlevel dielectric layer is next deposited followed by the opening of a contact hole in the interlevel dielectric layer, exposing the top surface of the heavily doped source and drain region, of the DRAM device. A polysilicon layer is patterned to create the stacked capacitor, polysilicon storage node shape, contacting the heavily doped source and drain region of the DRAM device. The interlevel dielectric layer, protecting the region of the semiconductor substrate used for the MOSFET logic device, is next removed. A gate insulator layer, thinner than the first gate insulator layer, is next formed on the surface of the region of semiconductor substrate, used for the MOSFET logic device, and on the surface of the polysilicon storage node shape. Another polysilicon deposition is next performed, followed by a patterning procedure, creating a polysilicon gate structure for the MOSFET logic device, and creating the polysilicon upper electrode shape, for the stacked capacitor DRAM device. Lightly doped source and drain regions are formed in areas of the MOSFET logic device, not protected by the MOSFET polysilicon gate structure, followed by formation of insulator spacers, on the sides of the MOSFET polysilicon gate structure. After heavily doped source and drain formation, for the MOSFET logic device, a second anneal, lower in temperature, and shorter in time, than the first anneal cycle, is performed.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The fabrication process used to integrate a stacked capacitor DRAM device, and a MOSFET logic device on a single semiconductor chip will now be covered in detail. The DRAM device described in this invention is comprised of an NFET transfer gate transistor. If desired this invention can be applied to a stacked capacitor DRAM device, comprised of PFET transfer gate transistors. This can be accomplished by creating an N well region, in the P type semiconductor substrate, and creating P type lightly doped, and P type heavily doped source and drain regions. In addition the MOSFET logic device described in this invention is again an NFET device. If desired this invention can be practiced using a PFET device, again by creating an N well region, in the P type semiconductor substrate, and forming P type source and drain regions.

Figure 1:
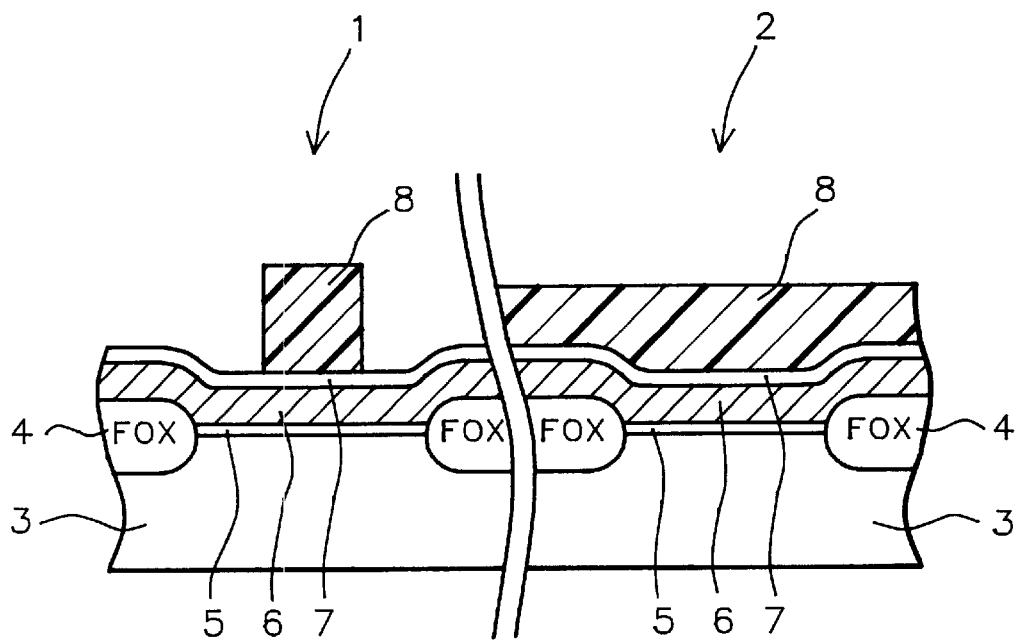
FIGS. 1–10, which schematically, in cross-sectional style, illustrates the stages of fabrication used to construct both a stacked capacitor, DRAM device, as well as a MOSFET logic device, on a single semiconductor chip.

FIG. 1, shows an area 1, to be used for fabrication of the stacked capacitor DRAM device, while the MOSFET logic device region, is shown in area 2. A P type, single crystalline silicon substrate, 3, having a <100>crystallographic orientation is used. Thick field oxide regions, 4, (FOX), are next formed for purposes of isolation. The FOX regions are formed by depositing a layer of silicon nitride on an underlying silicon dioxide layer, and using conventional photolithographic and RIE procedures to create the desired silicon nitride-silicon dioxide, composite oxidation mask. After photoresist removal using plasma oxygen ashing, followed by careful wet cleans, FOX regions 4, are formed, in areas not covered by the composite oxidation mask, via oxidation in an E oxygen-steam ambient, at a temperature between about 850° to 1050° C., to a thickness between about 3000 to 5000 Angstroms. The oxidation masking silicon nitride layer is removed via use of a hot phosphoric acid solution, followed by removal of the underlying silicon dioxide layer.

A first gate insulator layer 5, comprised of silicon dioxide, is thermally grown in an oxygen-steam ambient, at a temperature between about 750° to 1050° C., to a thickness between about 80 to 150 Angstroms, and shown schematically in FIG. 1. A layer of intrinsic polysilicon 6, is next deposited using low pressure chemical vapor deposition, (LPCVD), processing, at temperature between about 500° to 800° C., to a thickness between 2000 to 4000 Angstroms. The intrinsic polysilicon layer 6, is doped using $POCl_3$ procedures, however an alternative of doping intrinsic polysilicon layer 6, is the use of ion implantation procedures. In addition polysilicon layer 6, can be deposited using in situ doping procedures, via the addition of either arsine or phosphine, to a silane ambient. An overlying silicon oxide layer 7, is next deposited using either LPCVD or plasma enhanced chemical vapor deposition, (PECVD), procedures, to a thickness between about 500 to 1500 Angstroms. A photoresist shape 8, is formed in region 1, to be used as a mask to define a polysilicon gate structure, for the stacked capacitor DRAM device. This is schematically shown in FIG. 1.

Figure 2:
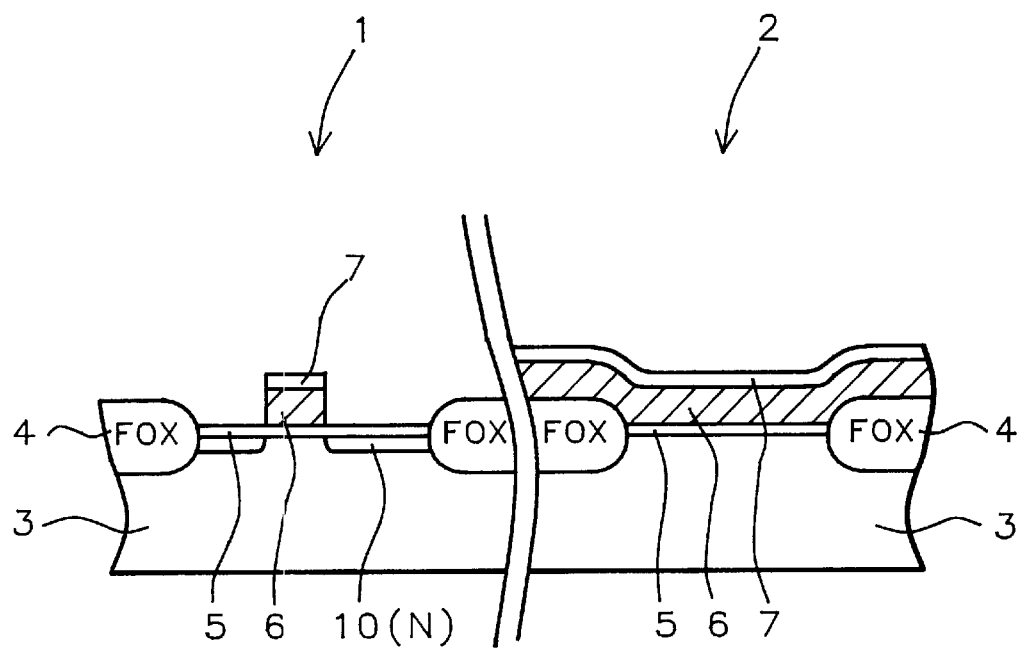
Figure 3:
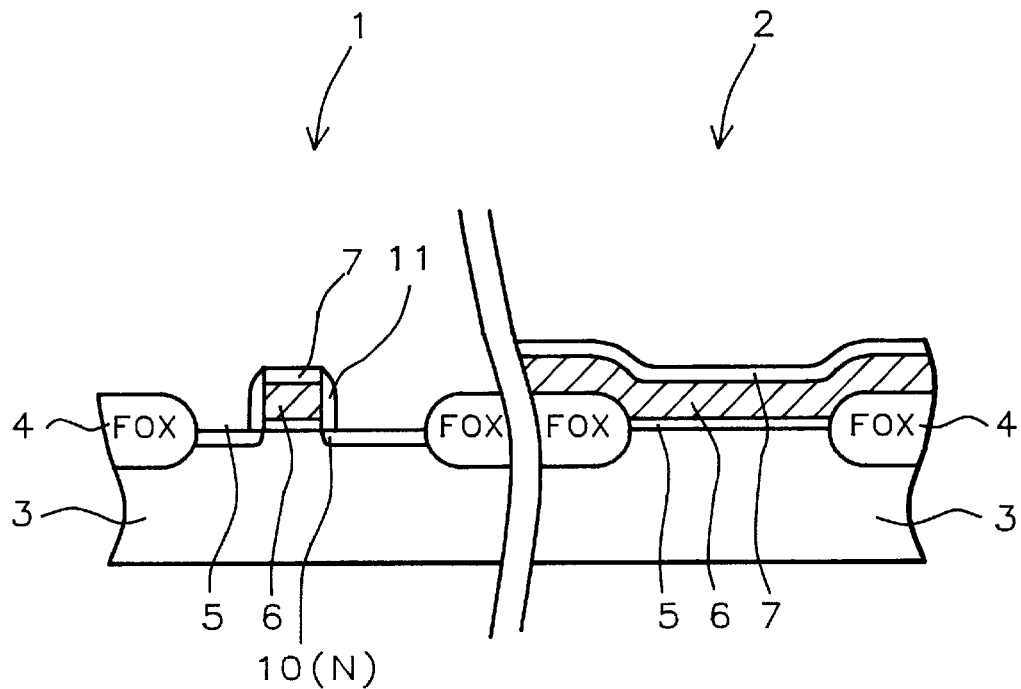
Figure 4:
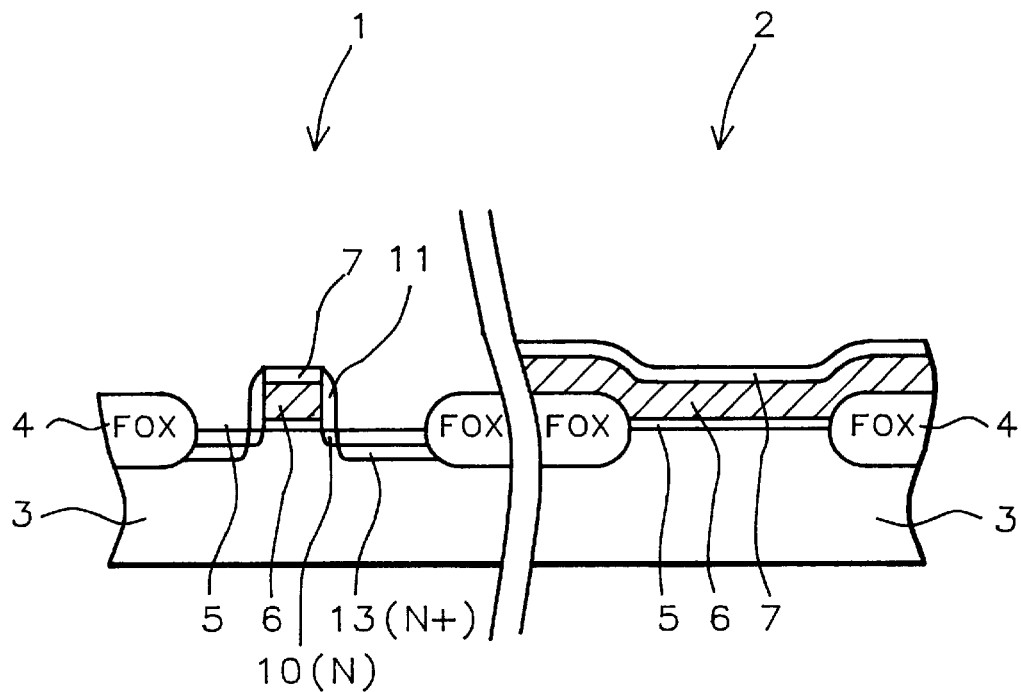

Anisotropic reactive ion etching, (RIE), is next performed, using $CHF_3$ as an etchant for silicon oxide layer 7, and $Cl_2$ as an etchant for polysilicon layer 6, in region 1, to create a polysilicon gate structure, using photoresist shape 8, as a mask, while masked silicon oxide layer 7, and polysilicon layer 6, are not etched during the anisotropic RIE procedure, in region 2. After removal of photoresist shape 8, an ion implantation procedure is used to create lightly doped source and drain region, (LDD), 10, for the stacked capacitor DRAM device, in region 1. LDD region 10, is formed via ion implantation of either arsenic or phosphorous, at an energy between about 25 to 50 KeV, at a dose between about 1E13 to 5E14 atoms/cm². This is schematically shown in FIG. 2. The energy of this implantation procedure is not large enough for implanted ions to reach semiconductor substrate 3, in region 2. Insulator spacers 11, are formed on the sidewalls of the polysilicon gate structure of the stacked capacitor DRAM device in region 1. The insulator spacers 11, schematically shown in FIG. 3, are formed by initially depositing a silicon oxide layer, via LPCVD or PECVD procedures, to a thickness between about 1000 to 3000 Angstroms, followed by an anisotropic RIE procedure, using $CHF_3$ as an etchant, creating insulator spacers 11. The deposition of insulator layer, and the RIE removal procedure, results in no net change for the structure in region 2. A heavily doped source and region 13, shown schematically in FIG. 4, is formed via ion implantation of either arsenic or phosphorous, at an energy between about 20 to 80 KeV, at a dose between about 1E15 to 5E15 atoms/cm². Semiconductor 3, in region 2, is again protected from the heavily doped source and drain ion implantation procedure, by overlying silicon oxide layer 7, and polysilicon layer 6. A first anneal cycle is next performed, using either conventional furnace procedures, or via a rapid thermal anneal, (RTA), procedure, to reduce insulator charge as well as junction leakages, which could adversely influence the operation of the stacked capacitor DRAM device. The first anneal cycle, when performed using conventional furnace procedures is accomplished in a nitrogen ambient, at a temperature between about 800° to 950° C., for a time between about 10 to 60 min. Using an RTA procedure, a temperature between about 950° to 1100° C., is used for between about 10 to 60 sec. The first anneal cycle is performed at this stage of integration, to allow the DRAM device to experience an anneal cycle that a subsequent MOSFET logic device, with shallow junctions, could not tolerate.

Figure 5:
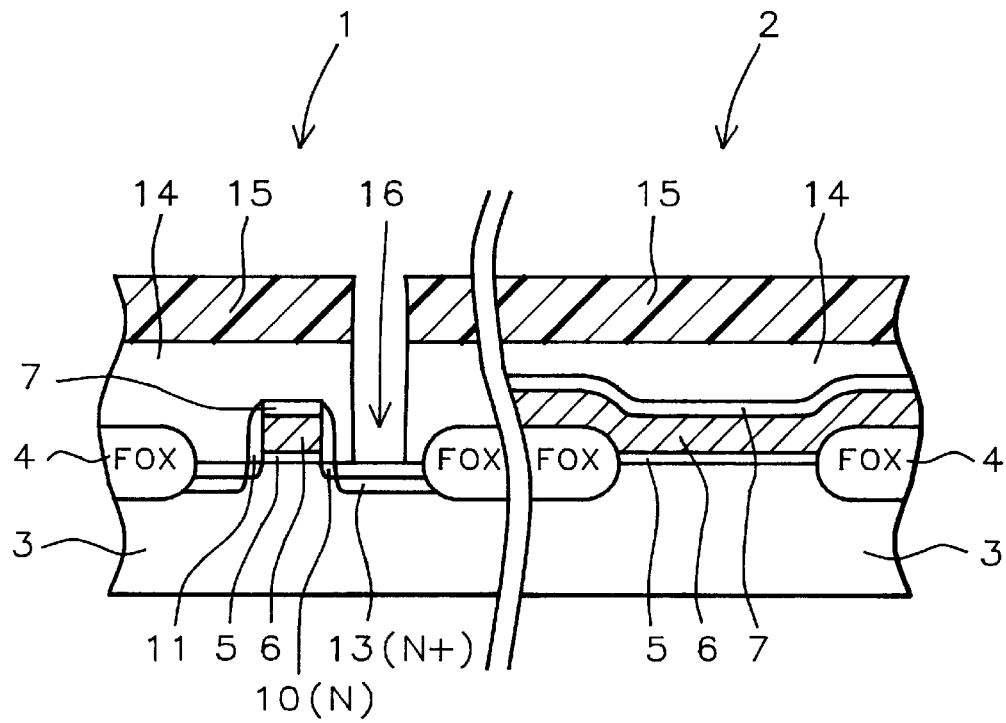

An interlevel dielectric layer 14, of silicon oxide, is next deposited using LPCVD or PECVD procedures, to a thickness between about 4000 to 15000 Angstroms. A chemical mechanical polishing procedure is employed to planarize interlevel dielectric layer 14, resulting in a smooth top surface. A photoresist shape 15, is formed on the interlevel dielectric layer 14, featuring an opening in photoresist shape 15, exposing a small region of interlevel dielectric layer 14, in region 1. The opening in photoresist shape 15, is transferred to interlevel dielectric layer 14, via anisotropic RIE procedures, using $CHF_3$ as an etchant, creating storage node contact opening 16, for the stacked capacitor DRAM device of region 1, schematically shown in FIG. 5.

Figure 6:
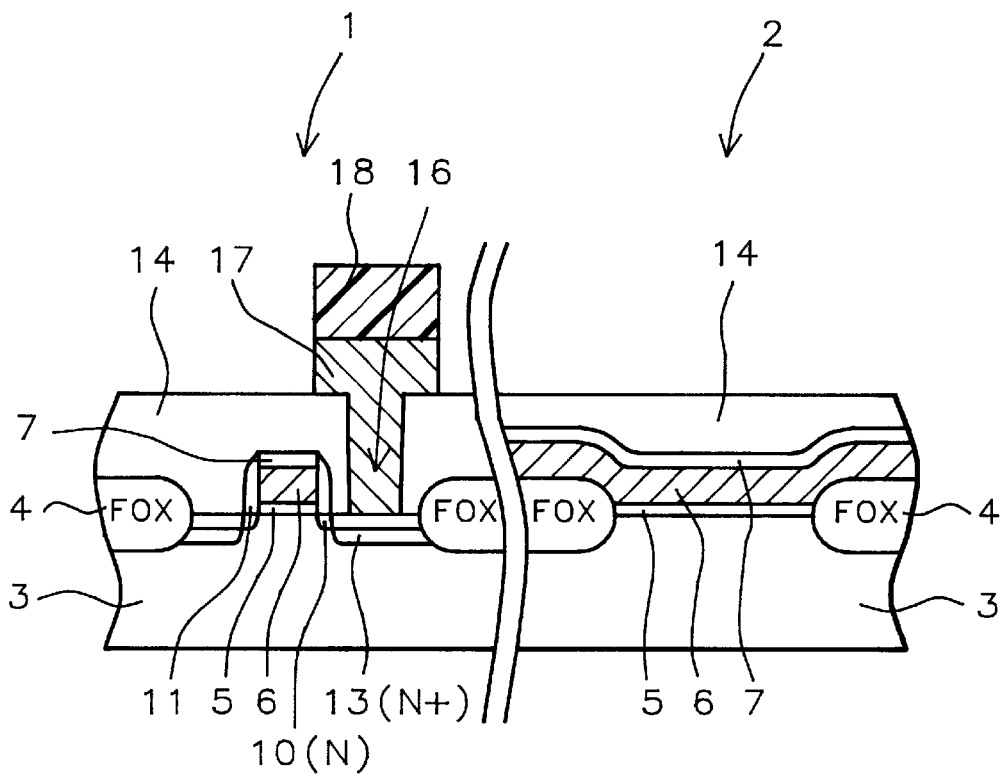
Figure 7:
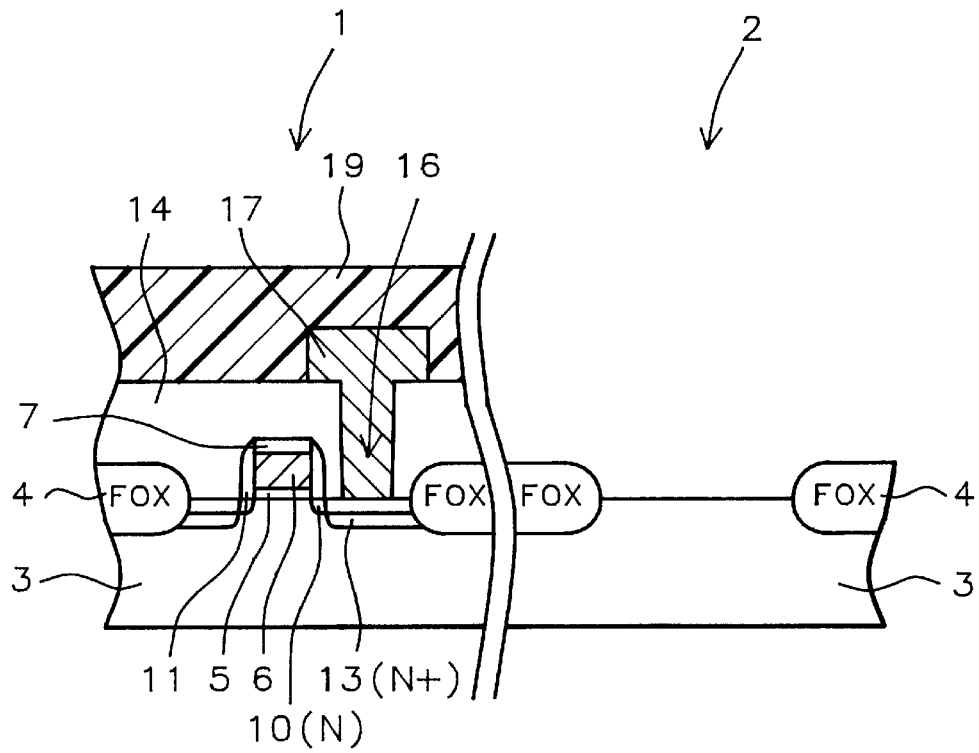
Figure 8:
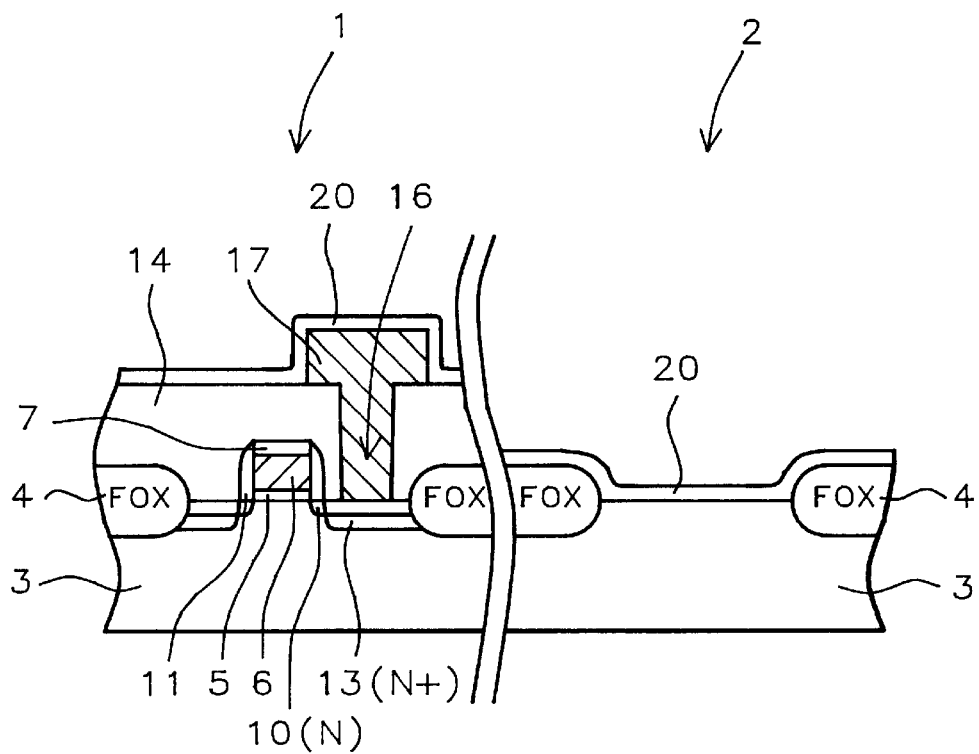

After removal of photoresist shape 15, via plasma oxygen ashing and careful wet cleans, a polysilicon layer 17, is deposited using LPCVD procedures, to a thickness between about 3000 to 10000 Angstroms. Polysilicon layer 17, is deposited using in situ doping procedures, via the addition of either arsine or phosphine, to a silane ambient. Photoresist shape 18, is next formed and used as a mask to create polysilicon storage node structure 17, via anisotropic RIE procedures, using $Cl_2$ as an etchant. Polysilicon storage node structure 17, contacts heavily doped source and drain region 13, in storage node contact opening 16. This is schematically shown in FIG. 6. After removal of photoresist shape 18, again via the use of plasma oxygen ashing and careful wet cleans, photoresist shape 19, is formed and used as a block-out mask to allow interlevel dielectric layer 14, silicon oxide layer 7, polysilicon layer 6, and gate insulator layer 5, to be removed to be removed from region 2, allowing processing the MOSFET logic device, in region 2, to commence. Interlevel dielectric layer 14, and silicon oxide layer 7, are removed via plasma procedures, using $CF_4$ as an etchant, while polysilicon layer 6, is removed via a plasma procedure, using $Cl_2$ as an etchant. Gate insulator layer 5, is removed using a buffered hydrofluoric acid solution. This is schematically shown in FIG. 7. After removal of photoresist block-out mask 19, using plasma oxygen ashing and careful wet cleans, an insulator layer 20, is formed on the semiconductor surface in region 2, to be used as the gate insulator layer of the MOSFET logic device, while insulator 20, formed on the exposed surfaces of storage node capacitor structure 17, will be used as the capacitor dielectric layer, for the stacked capacitor DRAM device, in region 1. Insulator layer 20, can be an Oxynitride-Nitride-Oxide, (ONO), layer, created by first thermally growing a silicon oxide layer, at a thickness between about 0 to 20 Angstroms, on the surface of polysilicon storage node structure 17, and on the surface of the semiconductor substrate, in region 2. Next a silicon nitride layer is deposited, using LPCVD or PECVD procedures, at a thickness between about 50 to 80 Angstroms, followed by an oxidation procedure, in an oxygen-stream ambient, at a temperature between about 750° to 900° C., converting the surface of the silicon nitride layer to a oxynitride. The resulting ONO layer 20, has a equivalent silicon oxide thickness between about 25 to 55 Angstroms. The thin ONO layer, used for the gate insulator of the MOSFET logic device, will offer enhanced performance, when compared to the performance obtained with the stacked capacitor DRAM structure, using a thicker, gate insulator layer 5. In addition the use of this same thin ONO layer 20, will result in increased capacitance for the stacked capacitor structure, of the DRAM device. The creation of the capacitor dielectric layer, and the gate insulator layer for the MOSFET logic device, is schematically shown in FIG. 8. Another alternative is the removal of the ONO layer from region 2, via photoresist block-out, and etching procedures, followed by growth of a thermal silicon dioxide layer, at a thickness between about 25 to 55 Angstroms.

Figure 9:
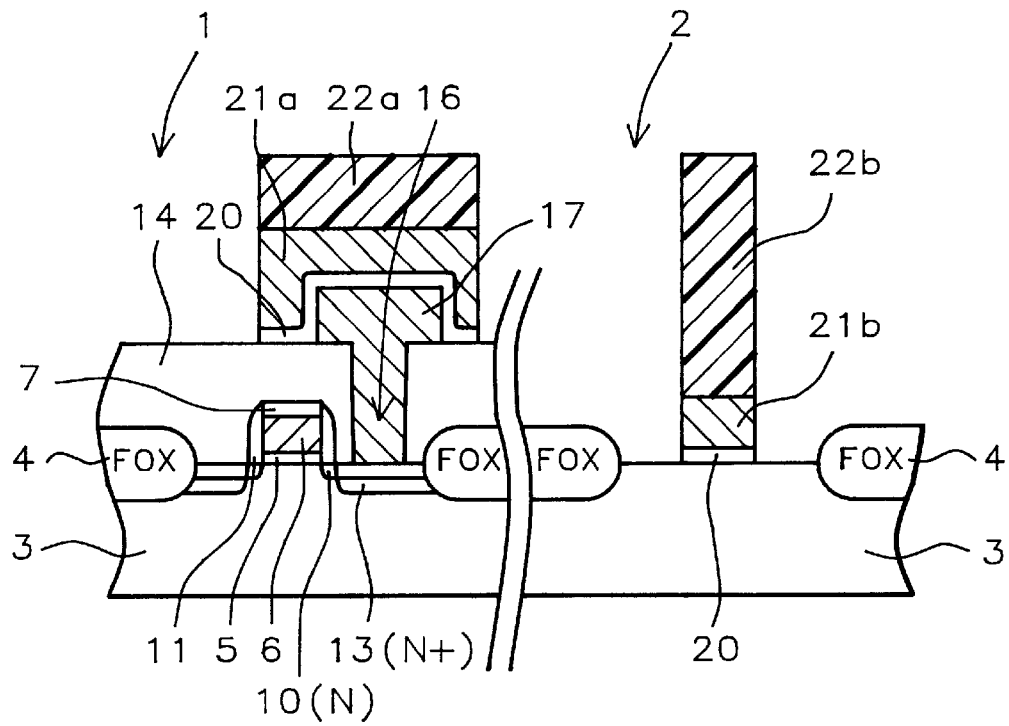

A polysilicon layer is next deposited using LPCVD procedures, to a thickness between about 1500 to 3000 Angstroms. The polysilicon layer is either deposited using in situ doping procedures, adding arsine or boron, to a silane ambient, or the polysilicon layer is deposited intrinsically and doped via ion implantation of either arsenic or phosphorous. Photoresist shape 22a, and photoresist shape 22b, are used as a mask to allow anisotropic RIE patterning of the polysilicon layer, using $Cl_2$ as an etchant, to occur, resulting in an upper polysilicon electrode 21a, to be formed for the stacked capacitor DRAM structure, of region 1, and a polysilicon gate structure 21b, being formed for the MOSFET logic device, in region 2. This is shown schematically in FIG. 9.

Figure 10:
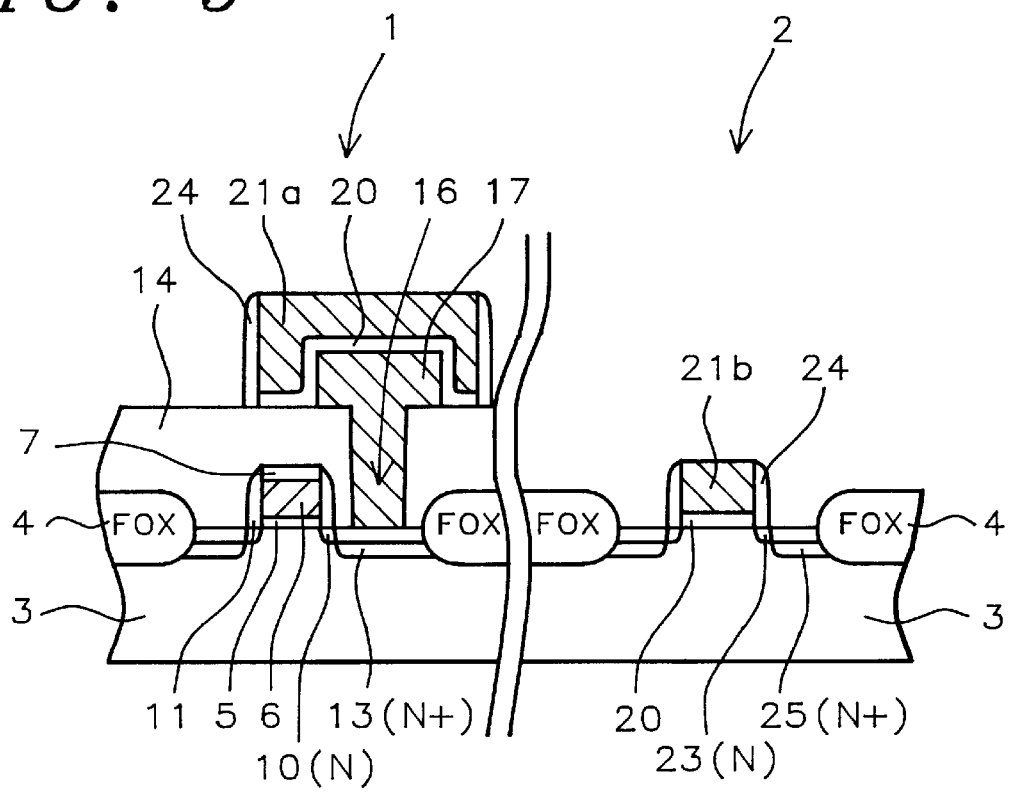

After removal of photoresist shapes 22a and 22b, via plasma oxygen ashing and careful wet cleans, another photoresist shape, (not shown ), is used to block out region 1, from an ion implantation procedure, used to create lightly doped source region 23, in region 2, for the MOSFET logic device, shown schematically in FIG. 10. The procedure is performed via ion implantation of either arsenic or phosphorous, at an energy between about 10 to 30 KeV, at a dose between about 1E13 to 5E14 atoms/$cm^2$.

After removal of the photoresist block out mask, insulator spacers 24, are formed on the sides of polysilicon gate structure 21b, via deposition of a silicon oxide layer, to a thickness between about 1000 to 3000 Angstroms, followed by an anisotropic RIE procedure, using $CHF_3$ as an etchant. Insulator spacers 24, are also formed on the sides of upper polysilicon electrode 21a. Another photoresist block out shape, (not shown), is used to create heavily doped source and drain region 25, for the MOSFET logic device, via ion implantation of either arsenic or phosphorous, at an energy between about 10 to 50 KeV, at a dose between about 1E15 to 5E15 atoms/$cm^2$. This is shown schematically in FIG. 10. After removal of the photoresist block out mask, via plasma oxygen ashing and careful wet cleans, a second anneal cycle is performed, using an RTA procedure, in an nitrogen ambient, at a temperature between about 900° to 1100° C., for a time between about 5 to 60 sec. This anneal cycle, less severe than the anneal cycle used for the DRAM device, stills allows charge reduction and junction leakage, in the MOSFET logic device to be realized, however without compromising the shallow junctions used for the MOSFET logic device.

While this invention has been particularly shown and described with reference to, the preferred embodiments thereof, it will be understood by those skilled in the art that various changes in form and details may be made without departing from the spirit and scope of this invention.

What is claimed is:

1. A method for fabricating a memory device, and a logic device, on the same single semiconductor chip, using an integrated fabrication process, comprising the steps of:

forming field oxide regions in a semiconductor substrate;

forming a first polysilicon gate structure, on a first gate insulator layer, in a first region of the semiconductor substrate, to be used for said memory device;

forming a first lightly doped source and drain region, in said first region of said semiconductor substrate, in an area not covered by said first polysilicon gate structure;

forming first insulator spacers, on sides of said first polysilicon gate structure;

forming a first heavily doped source and drain region in said first region of said semiconductor substrate, in an area not covered by said first insulator spacers, and not covered by said first polysilicon gate structure;

performing a first anneal cycle;

depositing an interlevel dielectric layer;

opening a contact hole in said interlevel dielectric layer, exposing said first heavily doped source and drain region, in said first region of said semiconductor substrate;

forming a lower polysilicon electrode structure, contacting said first heavily doped source and drain region, in said first region of said semiconductor substrate;

removing said interlevel dielectric layer, a first polysilicon layer, and said gate insulator layer, from a second region of said semiconductor substrate, to be used for said logic device;

growing an insulator layer on the exposed surface of said lower polysilicon electrode structure, in said first region of said semiconductor substrate, to be used as a capacitor dielectric layer for said memory device, and growing said insulator layer on the surface of said second region of said semiconductor substrate, exposed between field oxide regions, to be used as a second gate insulator layer for said logic device;

deposition and patterning of a polysilicon layer, forming an upper polysilicon electrode structure, overlying said capacitor dielectric layer, and said lower polysilicon electrode structure, in said first region of said semiconductor substrate, and forming a second polysilicon gate structure, on said second gate insulator layer, in said second region of said semiconductor substrate;

forming a second lightly doped source and drain region in said second region of said semiconductor substrate, in an area not covered by said second polysilicon gate structure;

forming second insulator spacers on the sides of said second polysilicon gate structure;

forming a second heavily doped source and drain region in said second region of said semiconductor substrate, in an area not covered by said second polysilicon gate structure, and not covered by said second insulator spacers; and performing a second anneal cycle.

2. The method of claim 1, wherein said memory device is a stacked capacitor DRAM device.

3. The method of claim 1, wherein said logic device is a MOSFET logic device.

4. The method of claim 1, wherein said first gate insulator layer is silicon dioxide, thermally grown in an oxygen-steam ambient, at a temperature between about 750° to 1050° C., to a thickness between about 80 to 150 Angstroms.

5. The method of claim 1, wherein said first anneal cycle is performed using a conventional furnace, in an nitrogen ambient, at a temperature between about 800° to 950° C., for a time between about 10 to 60 min.

6. The method of claim 1, wherein said first anneal cycle is performed using an RTA procedure, at a temperature between about 950° to 1100° C., for a time between about 10 to 60 sec.

7. The method of claim 1, wherein said interlevel dielectric layer is silicon oxide, obtained using LPCVD or PECVD procedures, to a thickness between about 4000 to 15000 Angstroms.

8. The method of claim 1, wherein said insulator layer is an Oxynitride-Nitride-Oxide, (ONO), layer, at an equivalent silicon oxide thickness between about 25 to 55 Angstroms, and used for said capacitor dielectric layer for said memory device, created by growing a silicon oxide layer, on a polysilicon storage node structure, to a thickness between about 0 to 20 Angstroms, depositing a silicon nitride layer, to a thickness between about 50 to 80 Angstroms, and oxidizing the surface of the silicon nitride layer, in an oxygen-steam ambient, at a temperature between about 750° to 900° C., to create a silicon oxynitride layer.

9. The method of claim 1, wherein said insulator layer is an Oxynitride-Nitride-Oxide, (ONO), layer, at an equivalent silicon oxide thickness between about 25 to 55 Angstroms, and used for said second gate insulator layer for said logic device, created by growing a silicon oxide layer, on the surface of said semiconductor substrate, depositing a silicon nitride layer, and oxidizing the surface of the silicon nitride layer to create a silicon oxynitride layer.

10. The method of claim 1, wherein said upper polysilicon electrode structure, for said memory device, and said second polysilicon gate structure, for said logic device, is created via deposition of a polysilicon layer, at a thickness between about 1500 and 3000 Angstroms, and patterned using photolithographic and anisotropic RIE procedures, using $Cl_2$ as an etchant.

11. The method of claim 1, wherein said second anneal cycle is performed, in an nitrogen ambient, via use of an RTA procedure, performed at a temperature between about 900° to 1100° C., for a time between about 10 to 60 sec.

12. A method for fabricating a stacked capacitor DRAM device, and a MOSFET logic device, on the same semiconductor chip, using an integrated fabrication process, comprising the steps of:

forming field oxide regions in a semiconductor substrate;

growing a first gate insulator layer on an area of said semiconductor substrate, to be used as the gate insulator for said stacked capacitor DRAM device;

depositing a first polysilicon layer;

patterning of said first polysilicon layer to create a first polysilicon gate structure, on said first gate insulator layer, for stacked capacitor DRAM structure;

forming a first lightly doped source and drain region, for said stacked capacitor DRAM device, in an area of said semiconductor substrate not covered by said first polysilicon gate structure;

forming first insulator spacers on the sides of said first polysilicon gate structure;

forming a first heavily doped source and drain region, for stacked capacitor DRAM device, in an area of said semiconductor substrate not covered by said first polysilicon gate structure, and not covered by said first insulator spacers;

performing a first anneal cycle;

depositing an interlevel dielectric layer;

opening a storage node contact hole in said interlevel dielectric layer, exposing said first heavily doped source and drain region;

depositing a second polysilicon layer;

patterning of said second polysilicon layer, creating a polysilicon storage node electrode, for said stacked capacitor DRAM device, contacting said first heavily doped source and drain region;

removing said interlevel dielectric layer from a region of said semiconductor substrate to be used for said MOSFET logic device;

forming a dielectric layer on the surface of said polysilicon storage node electrode, to be used as a capacitor dielectric layer for said stacked capacitor DRAM device, and forming said dielectric layer on the surface of said semiconductor substrate, to be used as a second gate insulator layer, for said MOSFET logic device;

depositing a third polysilicon layer;

patterning of said third polysilicon layer, creating an upper polysilicon electrode, for said stacked capacitor DRAM device, and creating a second polysilicon gate structure for said MOSFET logic device;

forming a second lightly doped region, for said MOSFET logic device, in an area of said semiconductor substrate not covered by said second polysilicon gate structure;

forming second insulator spacers on sides of said second polysilicon gate structure;

forming a second heavily doped source and drain region, for said MOSFET logic device, in an area of said semiconductor substrate not covered by said second insulator spacers, and not covered by said second polysilicon gate structure; and performing a second anneal cycle.

13. The method of claim 12, wherein said first gate insulator layer, used for said stacked capacitor DRAM device, is a silicon dioxide layer, thermally grown in an oxygen-steam ambient, to a thickness between about 80 to 150 Angstroms, at a temperature between about 750° to 1050° C.

14. The method of claim 12, wherein said first anneal cycle is performed using conventional furnace procedures, in an nitrogen ambient, at a temperature between about 800° to 950° C., for a time between about 10 to 60 min.

15. The method of claim 12, wherein said first anneal is performed using an RTA procedure, at a temperature between about 950° to 1100°C., for a time between about 10 to 60 sec.

16. The method of claim 12, wherein said dielectric layer, used for capacitor dielectric layer of said stacked capacitor DRAM device, is an Oxynitride-Nitride-Oxide, (ONO), layer, formed to an equivalent silicon oxide thickness between about 25 to 55 Angstroms, and formed by growing a silicon oxide layer on said polysilicon storage node electrode, to a thickness between about 0 to 20 Angstroms, depositing a silicon nitride layer, at a thickness between about 50 to 80 Angstroms, and oxidizing the silicon nitride surface, at a temperature between about 750° to 900° C., to create a silicon oxynitride layer.

17. The method of claim 12, wherein said dielectric layer, used as said second gate insulator layer for said MOSFET logic device, is an Oxynitride-Nitride Oxide, (ONO), layer, formed to an equivalent silicon oxide thickness between about 25 to 55 Angstroms, via growth of a silicon oxide layer on a region of said semiconductor substrate used for said MOSFET logic device, followed by the deposition of a silicon nitride layer, and an oxidation procedure, used to convert the surface of the silicon oxide layer to a silicon oxynitride layer.

18. The method of claim 12, wherein said dielectric layer is silicon dioxide, used as said second gate insulator layer for said MOSFET logic device, formed using thermal oxidation procedures to a thickness between about 25 to 55 Angstroms.

19. The method of claim 12, wherein said upper polysilicon electrode, for said stacked capacitor DRAM device, and said second polysilicon gate structure, for said MOSFET logic device, are formed via patterning of said third polysilicon layer, via anisotropic RIE procedures, using $Cl_2$ as an etchant.

20. The method of claim 12, wherein said second anneal cycle is performed using RTA procedures, at a temperature between about 900° to 1100° C., for a time between about 10 to 60 sec.

* * * * *